(12) United States Patent
Lien et al.

(10) Patent No.: US 9,576,624 B2
(45) Date of Patent: Feb. 21, 2017

(54) MULTI-DIMENTIONAL DATA RANDOMIZATION

(71) Applicant: Seagate Technology LLC, Cupertino, CA (US)

(72) Inventors: Nicholas Odin Lien, Farmington, MN (US); Ara Patapoutian, Hopkinton, MA (US); Jeffrey J. Pream, Berthoud, CO (US); Young Pil Kim, Eden Prairie, MN (US); David Orrin Sluiter, Superior, CO (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 137 days.

(21) Appl. No.: 14/319,021

(22) Filed: Jun. 30, 2014

(65) Prior Publication Data

US 2015/0378890 A1 Dec. 31, 2015

(51) Int. Cl.
| | | |
|---|---|---|
| *G06F 12/02* | (2006.01) | |
| *G06F 12/06* | (2006.01) | |
| *G11C 7/18* | (2006.01) | |
| *G11C 8/06* | (2006.01) | |
| *G11C 8/12* | (2006.01) | |
| *G11C 16/08* | (2006.01) | |

(52) U.S. Cl.
CPC . *G11C 7/18* (2013.01); *G11C 8/06* (2013.01); *G11C 8/12* (2013.01); *G11C 16/08* (2013.01)

(58) Field of Classification Search
CPC ............. G11C 16/08; G11C 7/18; G11C 8/06; G11C 8/12
See application file for complete search history.

(56) References Cited

U.S. PATENT DOCUMENTS

| | | | |
|---|---|---|---|
| 8,261,159 B1 | 9/2012 | Sommer et al. | |
| 8,402,349 B2 | 3/2013 | Lee et al. | |
| 2004/0223472 A1* | 11/2004 | Sankaran | H04L 25/03866 370/335 |
| 2008/0151618 A1 | 6/2008 | Sharon et al. | |
| 2012/0144277 A1 | 6/2012 | Lee et al. | |
| 2012/0287719 A1 | 11/2012 | Mun et al. | |
| 2012/0297111 A1 | 11/2012 | Hsu et al. | |
| 2013/0083619 A1 | 4/2013 | Jeon et al. | |
| 2013/0135934 A1 | 5/2013 | Kim et al. | |
| 2014/0215126 A1* | 7/2014 | Avila | G06F 12/0246 711/103 |

FOREIGN PATENT DOCUMENTS

| | | |
|---|---|---|
| JP | 2008-198299 A | 8/2008 |
| JP | 2009-157836 A | 7/2009 |
| JP | 2009-157841 A | 7/2009 |
| JP | 2010-538408 A | 12/2010 |
| JP | 2012-226822 A | 11/2012 |

* cited by examiner

*Primary Examiner* — Yong Choe
(74) *Attorney, Agent, or Firm* — Holzer Patel Drennan (57) ABSTRACT

The disclosed technology provides for multi-dimensional data randomization in a memory cell array using circular shifts of an initial scrambling sequence. Data addressed to a first row of a data array is randomized using the initial scrambling sequence and data addressed to each row of the memory cell array is randomized using a scrambling sequence that is equal to a circular shift of the initial sequence.

20 Claims, 6 Drawing Sheets

MULTI-DIMENTIONAL DATA RANDOMIZATION

BACKGROUND

Certain memories used in digital systems can experience data loss if too many physically-proximate data bits in the memory have the same bit value and surround a bit of opposite value. That is, if too many bits in physical proximity are zeros, data loss can occur for a one bit stored near the zeros. Similarly, if too many bits in physical proximity are ones, data loss can occur for a zero bit stored near the ones. To mitigate data loss in these types of memories, memory controllers may implement data randomization, also referred to as "data scrambling." The data scrambling mechanisms use reproducible pseudo-random modifications to change data written to memory, and to change the data back to the original data when read from the memory. By changing the data, the mix of ones and zeros is changed in an attempt to reduce the number of like-bits in physical proximity.

SUMMARY

Implementations described and claimed herein provide for data randomization in multiple dimensions of a memory array. In one implementation, a first scrambling sequence is used to randomize data addressed to a first row of the memory array, and a second scrambling sequence is used to randomize data addressed to a second adjacent row of the memory array. The second scrambling sequence is a circular shift of the first scrambling sequence.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

DETAILED DESCRIPTION

Figure 1:
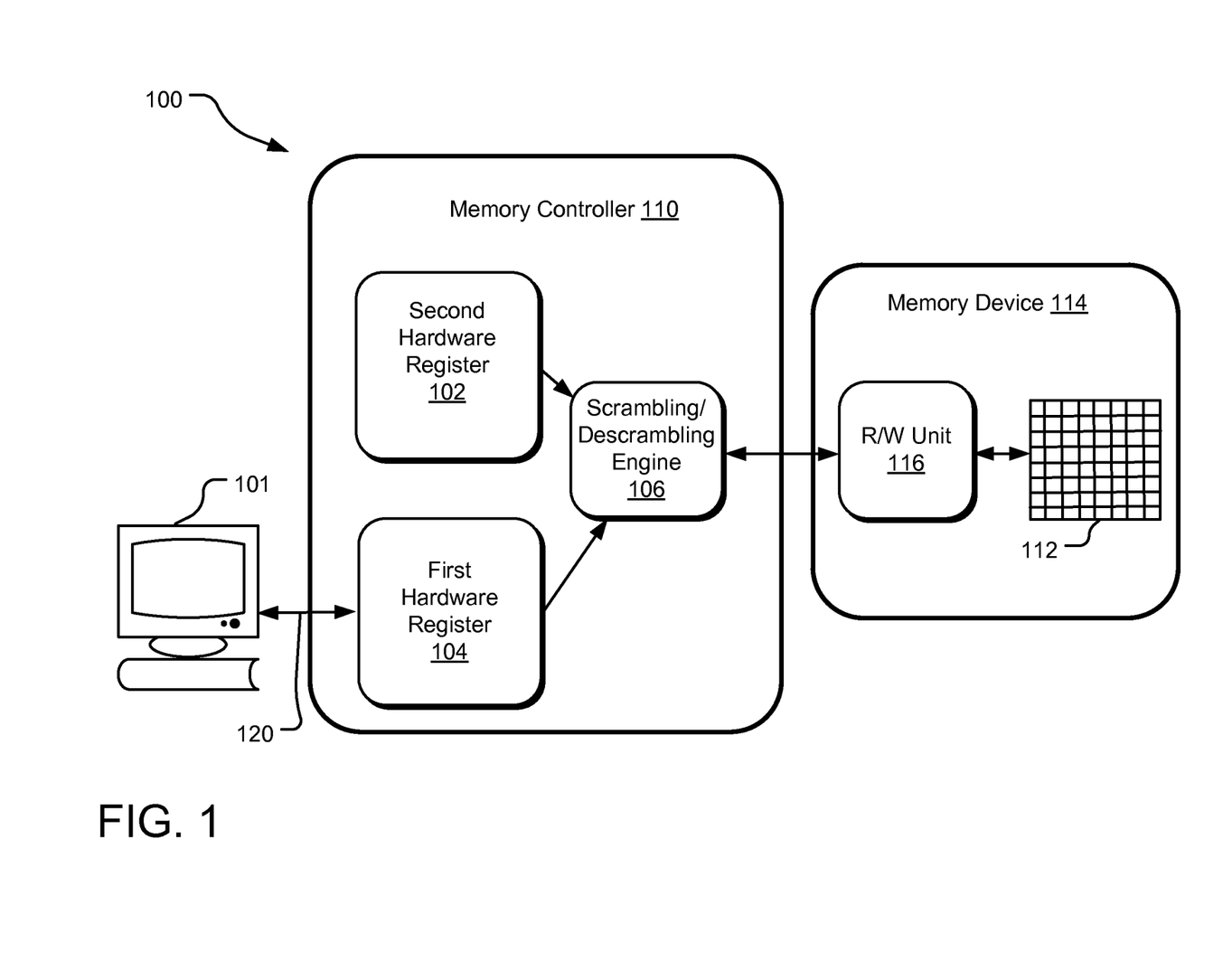
FIG. 1 illustrates an example system that randomizes data of a memory array in multiple dimensions.

FIG. 1 illustrates an example system 100 that randomizes data of a memory cell array 112 in multiple dimensions. The system 100 includes a memory controller 110 that stores and retrieves data in a memory device 114. The memory controller 110 communicates with a host 101 to accept data for storage in the memory device 114 and for outputting data retrieved from the memory device 114. The memory device 114 stores data received from the memory controller 110 in the memory cell array 112. In one implementation, the memory cell array 112 comprises multiple analog memory cells that hold a continuous, analog value such as an electrical voltage or charge. The memory cell array 112 may comprise analog memory cells of any kind, such as, for example, NAND, NOR, DRAM, SRAM, MRAM, ferroelectric RAM, magnetic RAM, spin-torque transfer RAM, resistive RAM, phase change memory, etc. The charge levels stored in the cells and/or the analog voltages or currents written into and read out of the cells are referred to herein collectively as analog values or storage values. The memory cell array 112 may be an individual memory array, or a three-dimensional stack of memory arrays, such as 3D NAND Flash Memory, 3D NOR Flash Memory, etc.

The system 100 stores data in the analog memory cells of the memory cell array 112 by programming the cells to assume respective memory states. The memory states are selected from a finite set of possible levels, and each level corresponds to a certain nominal storage value. For example, a single-level cell (SLC) can be programmed to store either one of two possible states in each memory cell, and a 2-bit multi-level cell (MLC) can be programmed to assume one of four possible programming levels by writing one of four possible nominal storage values into the cell.

The memory device 114 comprises a R/W unit 116, which converts data for storage in the memory device to analog storage values and writes them in to the memory cells. In other implementations, the R/W unit 116 does not perform the conversion, but is provided with storage values for storage in the cells. When reading data out of the memory cell array 112, the R/W unit 116 converts the storage values of memory cells into digital samples having a resolution of one or more bits.

The memory controller 110 includes an interface 120 for communicating with the host 101. Data accepted from the host 101 is temporarily loaded into a first hardware register 104. A second hardware register 102 stores a scrambling sequence usable by a scrambling/descrambling engine 106 to scramble the data from the host 101 before writing the to the memory cell array 112. In some implementations, the scrambling sequence is not stored in the second hardware register 102. For example, the scrambling/descrambling engine 106 may include an N-bit shift register (e.g., a linear feedback shift register (LFSR)) that dynamically generates the scrambling sequence. The N-bit shift register is seeded with an initial value, such as a value stored in the second hardware register 102, and uses taps to compute each additional bit in the sequence.

Scrambling, also referred to herein as data randomization, is performed to avoid severe inter-cell interference scenarios and to balance wear of the memory cells in the memory cell array 112. In some implementations, data is encoded by an encoder (not shown) after being scrambled but before being written to the memory cell array 112.

In one implementation, the memory controller 110 receives data from the host 101 that is addressed to multiple adjacent rows in the memory array 112. The data is temporarily loaded into the first hardware register 104, which is accessible to the scrambling/descrambling engine 106. Using the scrambling sequence stored in the second hardware register 102, the scrambling/descrambling engine 106 scrambles a portion of the data addressed to a first row of the memory cell array 112. The scrambling/descrambling engine 106 transmits the scrambled data to the R/W unit 116 of the memory device 114, which writes the scrambled data to the first row of the memory cell array 112.

Before writing data to the second row in the memory cell array 112, the scrambling/descrambling engine 106 circularly shifts the scrambling sequence by a predetermined number of digits. This circular shifting may be in either the clockwise direction or the counterclockwise direction. In one implementation, a barrel shifter of the scrambling/descrambling engine 106 performs the circular shift of the scrambling sequence. The resulting circularly-shifted scrambling sequence is used to scramble the data in the first hardware register 104 that is addressed to the second row of the memory cell array. The scrambling/descrambling engine 106 transmits the scrambled data to the R/W unit 116 of the memory device 114, which writes the data to the second row of the memory cell array 112.

Before writing data to the third row in the memory cell array 112, the scrambling/descrambling engine 106 again circularly shifts the scrambling sequence, and then uses the newly shifted scrambling sequence to scramble the data in the first hardware register 104 that is addressed to the third row. The scrambled data is directed to the memory device 114, where it is written to the third row of the memory cell array 112 by the R/W unit 116.

In the above-described manner, data addressed to each consecutive row of the memory cell array 112 is scrambled using a scrambling sequence that is circularly shifted as compared to the scrambling sequence used to scramble data of an immediately adjacent row in the memory cell array 112. This approach guarantees substantially even randomization along each individual row in the memory cell array 112 and also along each column. In some implementations where the memory cell array 112 is a 3-D memory array such as 3-D NAND, this approach also randomizes data in a third direction. Further benefits of this approach are more fully explored with respect to other implementations described herein.

Figure 2:
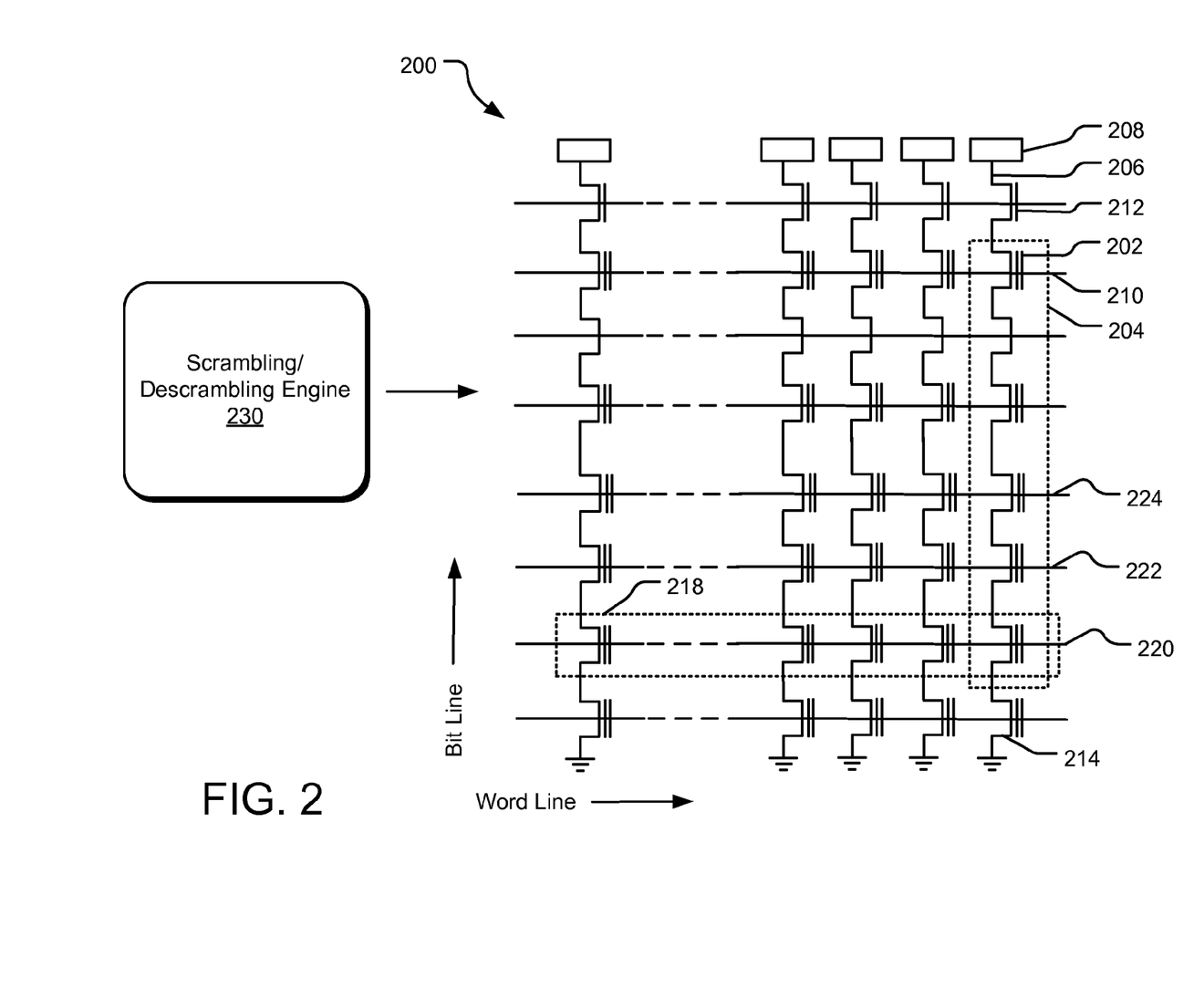
FIG. 2 illustrates an example memory array suitable for storing data randomized in multiple dimensions.

FIG. 2 illustrates an example memory array 200 (also referred to as a data array) suitable for storing data randomized in multiple dimensions. The memory array 200 includes a plurality of floating-gate transistor memory cells (e.g., cell 202) connected in series, in what are generally referred to as NAND strings (e.g., a string 204). This type of memory array 200 is known as NAND flash memory. It should be understood that NAND flash is merely one example type of memory suitable for use with the disclosed technology. Other types of memory, including those that do not utilize electron trapping, are also contemplated for use with the disclose data randomization techniques.

Each NAND string is coupled to a bitline (e.g., a bitline 206 from which a symbol can be read via an output bus (e.g., bus 208)). The cells of adjacent NAND strings are coupled via wordlines (e.g., wordline 210) that select which row of memory cells are be affected by reading and programming operations. Select gates 212, 214 also selectably couple the NAND strings to respective bitlines and ground during reading and program operations. Generally, each wordline may be associated with one or more pages (e.g., page(s) 218), which are the smallest physically addressable data unit. The size of the page in bits (which may include both user data and error correction codes, or ECC) corresponds to the number of NAND strings in the wordline. An MLC memory array stores multiple pages on a wordline by encoding corresponding bits (e.g., all bit 0's from each page) into a unique charge level within each cell.

Flash memory retains state by charging a floating gate to a particular voltage. This results in a predefined amount of current flowing through the channel when a specified read voltage is applied. Other types of memory may also be suitable for storing data randomized in more than one direction including non-volatile solid-state memory cells with fewer or greater bits of data per cell.

According to one implementation, a scrambling/descrambling engine 230 uses a first scrambling sequence to scramble data addressed to cells of the first wordline (WL0 220). The scrambling/descrambling engine 230 circularly shifts the initial scrambling sequence by a predetermined number of digits and then uses the shifted sequence to scramble data addressed to cells of a next adjacent wordline (WL1 222). Thereafter, the scrambling/descrambling engine again circularly shifts the already-shifted scrambling sequence and uses the resulting sequence to scramble data addressed to cells of the third wordline (WL2 224). In this manner, data written to each consecutive wordline is scrambled based on a scrambling sequence that is circularly shifted relative to the adjacent, previously-randomized wordline.

As a result, a write operation to the memory array 200 results in a data distribution that is randomized in the wordline direction and also in the bitline direction.

Figure 3:
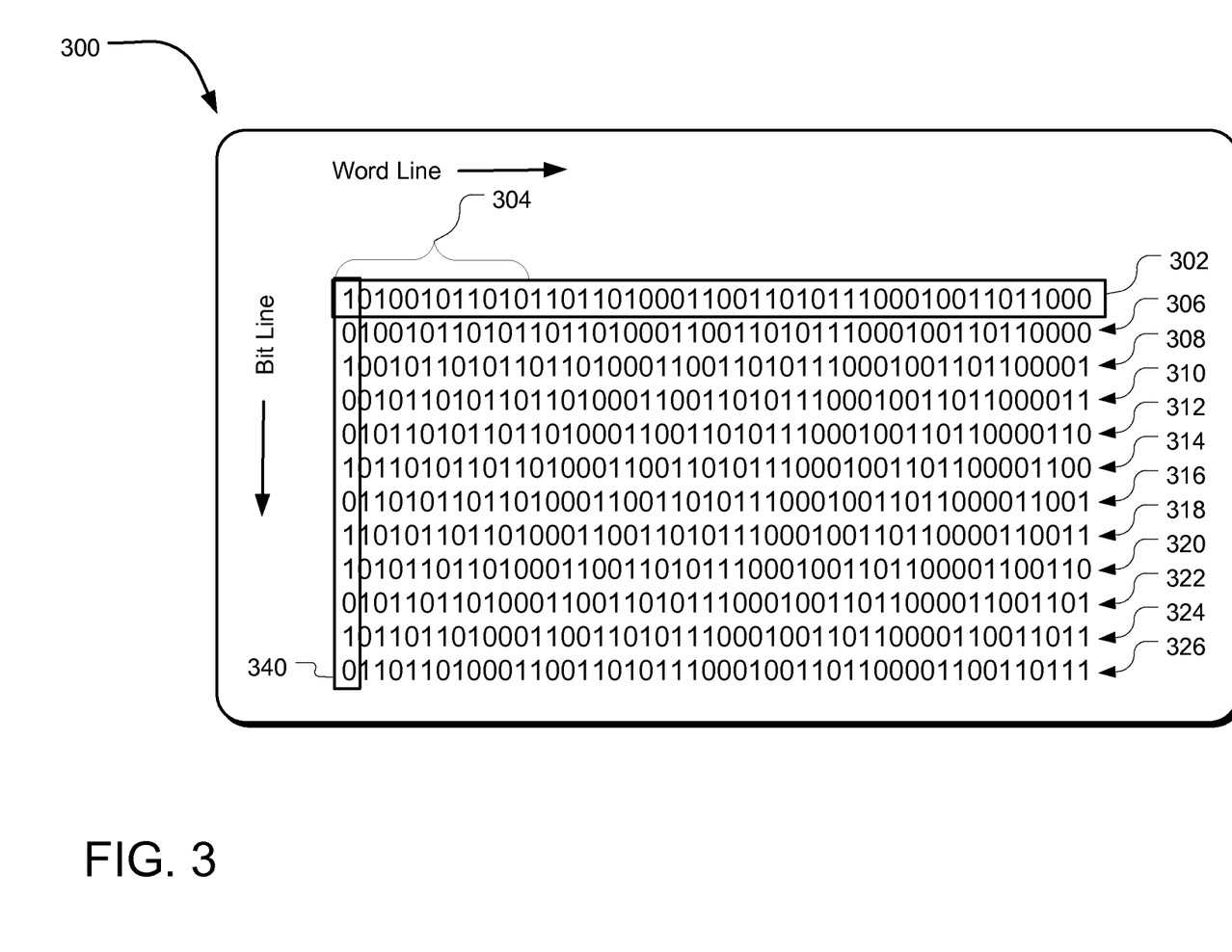
FIG. 3 illustrates iterative circular shifts of an example scrambling sequence for randomizing data of an single-level cell (SLC) memory array.

FIG. 3 illustrates iterative circular shifts 300 of an example scrambling sequence 302 for randomizing data of an SLC memory array (not shown). In one implementation, the scrambling sequence 302 is accessible by a scrambling/descrambling engine of a storage device and used to calculate a bit-wise XOR with data to randomize the data in multiple dimensions of the SLC memory array.

A variety of types of scrambling sequences 302 are contemplated for use. In one implementation, the scrambling sequence 302 is a maximum length sequence (m-sequence) generated from an N-bit number commonly referred to as a seed (e.g., a seed 304).

An m-sequence is a sequence typically generated using a linear feedback shift-register and Exclusive OR (XOR) gates. Taps are applied to certain bits in the N-bit number, and an XOR is calculated using the tapped bits to create a new binary bit that is added to the end of the N-bit number. To generate an m-sequence, the feedback XOR taps form the coefficients of a primitive polynomial. The bits are shifted by one digit, and the process is repeated until every possible binary combination in $2^N$ states is included in the resulting sequence exactly once. The length of the m-sequence is $2^{N-1}$.

In the example implementation shown, the m-sequence is a pseudorandom sequence based on the seed 304, which is an N=12-bit seed. In other implementations, seeds of different lengths are utilized. Because the seed 304 includes 12 bits, the corresponding m-sequence includes $2^{12}$ possible binary states. The full sequence length of $2^{12}-1=4095$ bits is too long for practical illustration, so it should be understood that the scrambling sequence 302 (e.g., the top row of the illustrated data block) illustrates but a first portion of this m-sequence rather than the full sequence. However, the term "scrambling sequence 302" is used herein to refer to a full scrambling sequence, which may be a full m-sequence, a portion of an m-sequence, or portions of two different m-sequences appended together, etc.

If the number of bits (K) stored in a wordline of the memory array is less than the full m-sequence, then the scrambling sequence 302 may be a truncated portion of the full m-sequence with a length K. If, on the other hand, the number of bits stored in a wordline is longer than the full m-sequence, multiple m-sequences can be appended together to form the scrambling sequence 302 of length K.

The scrambling sequence 302 utilized in the data randomization may be of a variety of different lengths. In one implementation, the scrambling sequence 302 has a total number of digits that is less than the total number of pages in the memory device. In the same or another implementation, the scrambling sequence 302 has a total number of digits that is large enough to permit every possible program state to occur on every possible cell in the memory device. For example, if the memory device is an MLC NAND permitting for different 4 states per cell and having K number of total cells, the m-sequence is at least 2K bits long.

M-sequences are good candidates for scrambling sequences because they offer ideal randomizing properties. Within any given m-sequence, the probability that there will be "i" number of consecutive zeros is given by $(½)^i$ where 'i' is less than the number of digits "N" in the N-bit seed.

The scrambling sequence 302 can be generated in a variety of ways. In one implementation, the scrambling sequence 302 is generated in advance and stored in a file (e.g., a memory such as on-chip SRAM) accessible by a scrambling/descrambling engine that writes user data to a memory array (not shown). In other implementations, the scrambling sequence 302 is dynamically generated during the scrambling or descrambling of data. For example, the scrambling/descrambling engine may include a shift register that is loaded with an N-bit seed to create the m-sequence.

Before writing data to a first row (e.g., a first wordline) of a memory array a scrambling/descrambling engine uses the scrambling sequence 302 to scramble the data addressed to the first row. In one implementation, the scrambling/descrambling engine scrambles the data by calculating a bit-wise XOR between the scrambling sequence 302 and the data addressed to cells of the first row the memory array. The number of digits of the m-sequence utilized in this calculation is equal to the number of data cells in the first row written to in the write operation.

After scrambling the data of the first row of the memory array, the scrambling sequence 302 is circularly shifted by one digit (e.g., to the left one digit), as illustrated by a first shifted scrambling sequence 306 (e.g., the second row of the illustrated data block). The scrambling/descrambling engine uses the first shifted scrambling sequence 306 to scramble the data addressed to cells of the second row. For example, the scrambling/descrambling engine may scramble the data by calculating a bit-wise XOR between the first shifted scrambling sequence 306 and the data addressed to the cells of the second row.

After scrambling the data addressed to the second row of the memory array, the first shifted scrambling sequence 306 is again circularly shifted by one digit (e.g., to the left one digit), as illustrated by a second shifted scrambling sequence 308. In the same manner as described above, the second shifted scrambling sequence 308 is used to scramble data addressed to the third row of the memory array.

Scrambling sequences 310 to 326 in descending order from the top of the illustrated data block each represent circularly shifted scrambling sequences used to scramble data addressed to rows 4 through 12 of the memory array, respectively.

Although FIG. 3 illustrates single-digit circular shifts, the magnitude of the circular shift is not limited to single digit shifts and may take on a variety of values in different implementations. However, one consequence of single-digit circular shifting is that the scrambling sequence used to randomize any given row M in the memory array is the same, in part, as a scrambling sequence applied to randomize a corresponding column L (the corresponding row/column being the case where M=L).

For example, a scrambling sequence 340 of bitline 0 is equal to a first portion of the scrambling sequence 302 of wordline 0; likewise, the scrambling sequence of bitline 1 is equal to a first portion of the scrambling sequence of wordline 1; and so forth. Since the number of wordlines in a memory array may differ from the number of bitlines, scrambling a row M may entail use of a longer or shorter scrambling sequence than that used to scramble a corresponding column L, where L=M. Therefore, the scrambling sequences of each wordline and corresponding bitline are identical up to X number of digits that the sequences have in common. In one implementation where there are more bitlines and/or wordlines than the length of the m-sequence, the scrambling sequence 302 may begin to repeat itself after circularly shifted through each iteration. For example, if the scrambling sequence is 512 bits long, then bitlines 0 and 512 may be identical.

As a result of this circular shifting and scrambling, both the wordline axis and the bitline axis receive randomization via m-sequence generation and no correlation is maintained between wordlines or bitlines.

Figure 4:
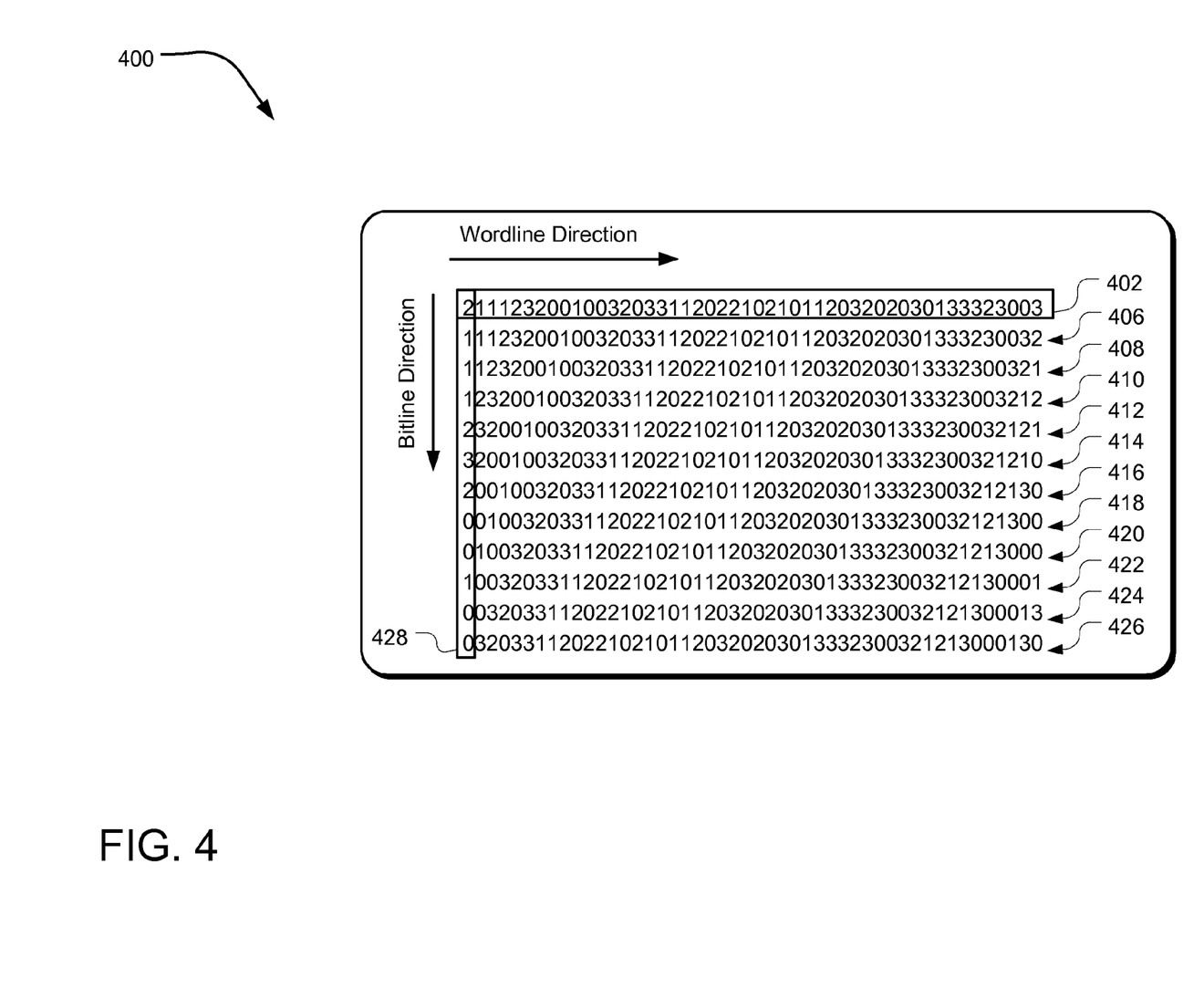
FIG. 4 illustrates iterative circular shifts of an example quaternary scrambling sequence for randomizing data of a multi-level cell (MLC) memory array.

FIG. 4 illustrates iterative circular shifts 400 of an example quaternary scrambling sequence 402 for randomizing data of a memory array (not shown). In the example shown, the memory array may be an MLC array, where each data cell stores two data bits that form one of a possible four different states (e.g., 00, 01, 10, 11). The first digit stored in a 2-bit data cell is commonly referred to as a least significant bit (LSB), while the second digit stored in a 2-bit data cell is commonly referred to as a most significant bit (MSB). The LSB and MSB of any given data cell belong to two different pages in the memory array.

The quaternary scrambling sequence 402 (e.g., the top row of the illustrated quaternary data block) illustrates but a first portion of a quaternary scrambling sequence, and not the full sequence. However, the term "quaternary scrambling sequence 402" is used herein to refer to the full sequence, and not merely a portion of it.

The quaternary scrambling sequence 402 is formed with digits of the quaternary alphabet (0, 1, 2, 3), where each of the digits (0, 1, 2, 3) refers to one of the possible MLC states (00, 01, 10, 11). The quaternary scrambling sequence 402 is, in one implementation, generated using a primitive polynomial to make the same type of non-repeating m-sequence as described with respect to the binary case of FIG. 3. For example, the primitive polynomial may be $1+x+x^2$ with a primitive root a. In such case, the quaternary alphabet can be represented by $(1, \alpha, \alpha^2, 1+\alpha)$, where '00' corresponds to 1, '01' corresponds to $\alpha$, '10' corresponds to $\alpha^2$, and '11' corresponds to $1+\alpha$.

Depending on the size of the memory array receiving the scrambled data, the primitive polynomials may not, in all circumstances, be capable of generating scrambling sequences of suitable lengths. In such case, a scrambling sequence that provides approximately the same desired effect as a true m-sequence can be computed in other ways.

In one example implementation, the quaternary scrambling sequence 402 is generated by randomly permuting an array of values of suitable length and size. One example array includes 256 values, where each value is formed of 4-character quaternary symbols (e.g., of the form [0000], [0001], [0002], [0010], etc.) consisting of the four characters of the quaternary alphabet (0, 1, 2, 3). Once formed, the array is randomly permuted using one or a several suitable randomization techniques, and the different values are appended together to form the quaternary scrambling sequence 402.

Once generated, the quaternary scrambling sequence 402 is split into two different binary sequences. This is done by assigning one of the four possible 2-bit binary values ('00', '01', '10', and '11') to each of the quaternary characters (0, 1, 2, and, 3), where the first bit represents scrambling applied to the LSB of a corresponding cell and the second bit represents scrambling applied to the MSB of the corresponding cell. The LSB and MSB values are then separated into two different binary sequences so that a first binary sequence includes the LSB values and a second binary sequence includes the MSB values. The two resulting binary sequences are stored, for example, in two different hardware registers of a memory controller of the memory array.

Before writing data addressed to cells in a first row (e.g., a first wordline) of the MLC memory array, a scrambling/descrambling engine uses the quaternary scrambling sequence 402 to scramble the data. In one implementation, the scrambling/descrambling engine scrambles the data addressed to LSBs of the first row by calculating a bit-wise XOR between the LSBs of each cell and a corresponding bit in the first stored binary sequence. In addition, the scrambling/descrambling engine scrambles the data addressed to the MSBs of the first row by calculating a bit-wise XOR between the MSBs of each cell and a corresponding bit in the second stored binary sequence.

After scrambling the data addressed to cells of the first row of the memory array, the quaternary scrambling sequence 402 is (in effect) circularly shifted by one digit (e.g., to the left one digit), as illustrated by a first shifted scrambling sequence 406 in the second row of the illustrated quaternary data block. As explained above, the memory controller may not physically store the quaternary values (0, 1, 2, 3) of the scrambling sequence 402, but rather, store a representation of such values in the form of the first binary sequence and the second binary sequence. Therefore, the circular shift illustrated by the first shifted quaternary scrambling sequence 406 may be implemented as a circular shift of the first binary sequence and of the second binary sequence.

Before writing data to a second row (e.g., a second wordline), of the memory array, a scrambling/descrambling engine uses the first shifted scrambling sequence 406 (e.g., implemented as two separate, shifted binary sequences) to scramble the LSB and MSB data bits of the second row. For example, the scrambling/descrambling engine may scramble LSB data bits by calculating a bit-wise XOR between the LSB data bits and the first binary sequence, and scrambling MSB data bits by calculating a bit-wise XOR between the MSB data bits and the second binary sequence.

After scrambling the data bits addressed to the second row of the memory array, the first shifted scrambling sequence 406 is again circularly shifted (in effect) by one digit (e.g., to the left one digit), as illustrated by a second shifted scrambling sequence 408 in the third row of the illustrated data block. As described above, this effect may be implemented as another circular shift of the first binary sequence also of the second binary sequence. In the same manner as described above, the scrambling/descrambling engine uses the second shifted scrambling sequence 408 to scramble the LSBs and MSBs of the third row.

Scrambling sequences 410 to 426 in descending order from the illustrated data block each represent further circularly shifted quaternary scrambling sequences used to scramble data addressed to rows 4 through 12 of the memory array, respectively.

The magnitude of the circular shift employed can be any predetermined value and is not limited to a single-digit shifting, as shown. However, one consequence of single-digit circular shifting is that the scrambling sequence applied to randomize MSBs or LSBs in any given row in the memory array is the same, in part, as a scrambling sequence applied to randomize a corresponding column of MSBs or LSBs.

For example, a first portion of the scrambling sequence of LSBs of wordline M (where M=0, 1, 2, 3, etc.) is also used to scramble LSBs along a corresponding bitline (L), where L=M. For example, the scrambling sequence used to scramble bitline 0 (e.g., indicated by box 428) is identical to a first portion of the scrambling sequence 402 used to scramble wordline 0. Likewise, the scrambling sequence used to scramble bitline 1 is identical to a first portion of the first scrambling sequence 402 used to scramble wordline 1.

As a result of this circular shifting and scrambling, both the wordline axis and the bitline axis receive randomization via the m-sequence generation and no correlation is maintained between wordlines or bitlines.

The above-described methodology significantly decreases the probability of error in an MLC device by guaranteeing that 25% of the bits in the wordline direction assume each of the four cell states, and that 25% of the bits in the bitline direction assume each of the four cell states. This concept can be extended to randomize data in memory arrays holding more than two data bits per cell. For example, an octonary scrambling sequence can be generated and used to randomize data of a triple level cell (TLC) flash array.

Figure 5:
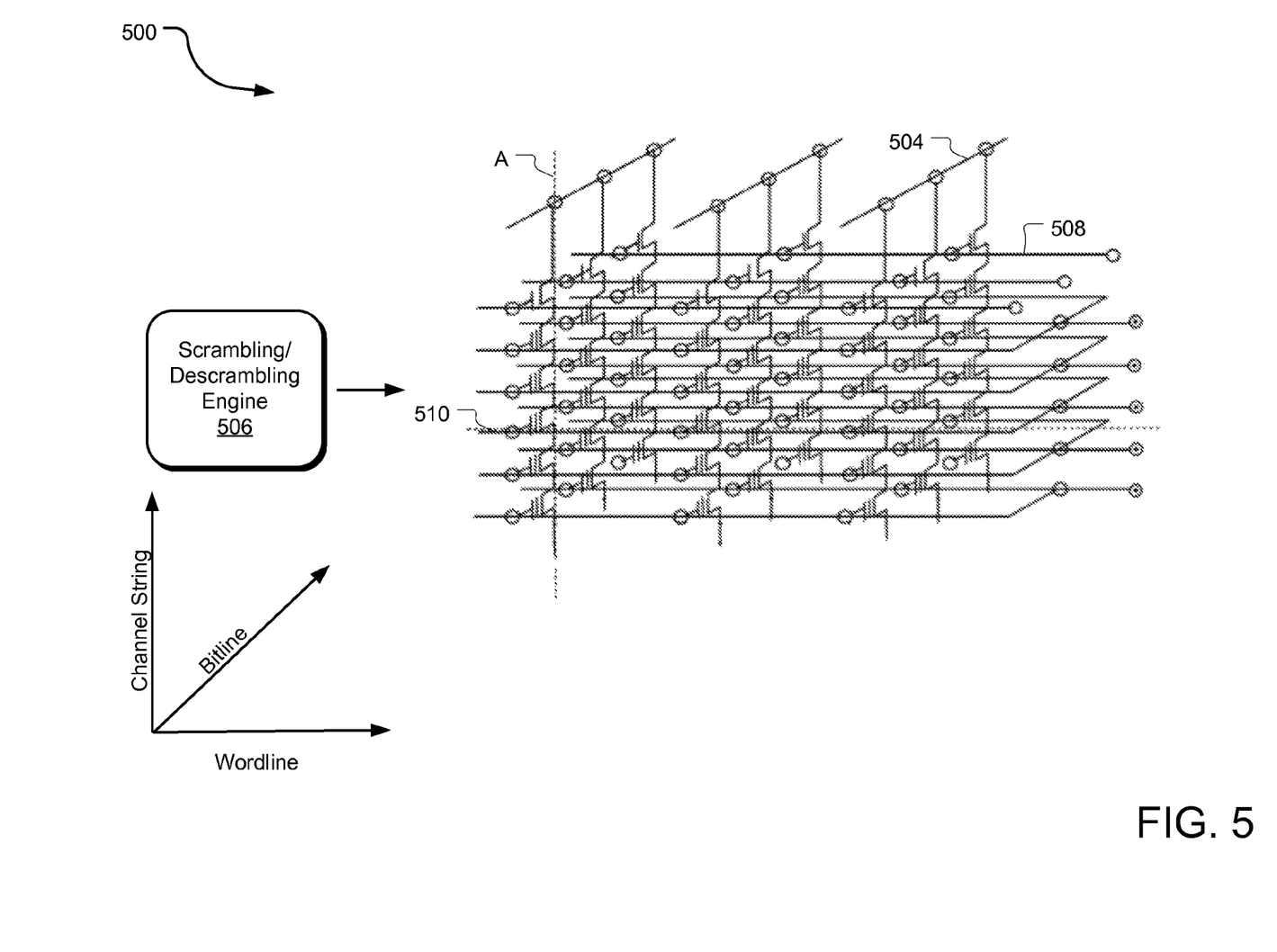
FIG. 5 illustrates an example memory array suitable for storing data randomized in multiple dimensions.

FIG. 5 illustrates an example memory block 500 (e.g., 3D NAND) suitable for storing data randomized in three dimensions. This type of memory block is a 3D NAND block that includes cells of adjacent NAND strings coupled via wordlines (e.g., a wordline 510), and also includes select gates that selectably couple the NAND strings to respective bitlines (e.g., a bitline 504). A third dimension of memory cells, referred to as the channel string (A), is selected by activating a bitline (504) and a channel selection line (508). In 3D NAND flash, the collection of wordline direction is also sometimes referred to as a wordline plane. The scrambling methodology described below yields three-dimensional data randomization in each of the bitline (BL), wordline (WL), and channel select line (CSL) directions.

Within any individual channel select line of the memory block 500, data scrambling is performed in a manner the same or similar to that described with respect to FIGS. 3-4. For example, within any one of the channel select lines, a scrambling/descrambling engine 506 may scramble data of each of N wordlines in by iterating a circular shift of an initial scrambling sequence used for the first wordline of that channel select line. Therefore, if a circular shift of '1' is utilized, the scrambling sequence for any given wordline M (e.g., with wordlines numbered 0-M) of a channel select line is based on the initial scrambling sequence of the channel select line shifted by M digits. For example, WL 1 of CSL 0 is scrambled using the initial scrambling sequence of WL 0, CSL 0 shifted by 1 digit; WL 2 of CSL 0 is scrambled using the initial scrambling sequence of WL 0, CSL 0 shifted by 2 digits, etc. Circular shifts of magnitude greater than one are contemplated for use in some other implementations.

When the circular shift of '1' is employed in the above-described manner, the scrambling sequence for each wordline becomes identical to the scrambling sequence for a corresponding bitline within each individual channel select line. By extending this methodology a step further, data can be randomized in the channel select line direction so that the scrambling sequence of any wordline is equal to that of a corresponding bitline and also equal to that of a corresponding channel select line.

In one implementation, this third-dimension of data randomization is implemented by scrambling a first wordline of each channel select line with an initial scrambling sequence that is circularly shifted as compared to the scrambling sequence used to scramble the first wordline of an adjacent channel select line. If, for example, a shift of "1" is utilized, the following may result: WL 0 of CSL 0 is scrambled with an initial scrambling sequence; WL 0 of CSL 1 is scrambled with CSL 0's initial scrambling sequence shifted by 1; WL 0 of CSL 2 is scrambled with CSL 0's initial scrambling sequence shifted by 2, etc. Within each of the channel select lines, data is scrambled as described above.

This guarantees data randomization in three dimensions. When the storage device is an MLC device with four memory states, this approach guarantees that 25% of the bits in the wordline direction assume each of the four cell states; 25% of the bits in the bitline direction assume each of the four cell states; and 25% of the bits in the channel select line direct assume each of the four cell states.

Figure 6:
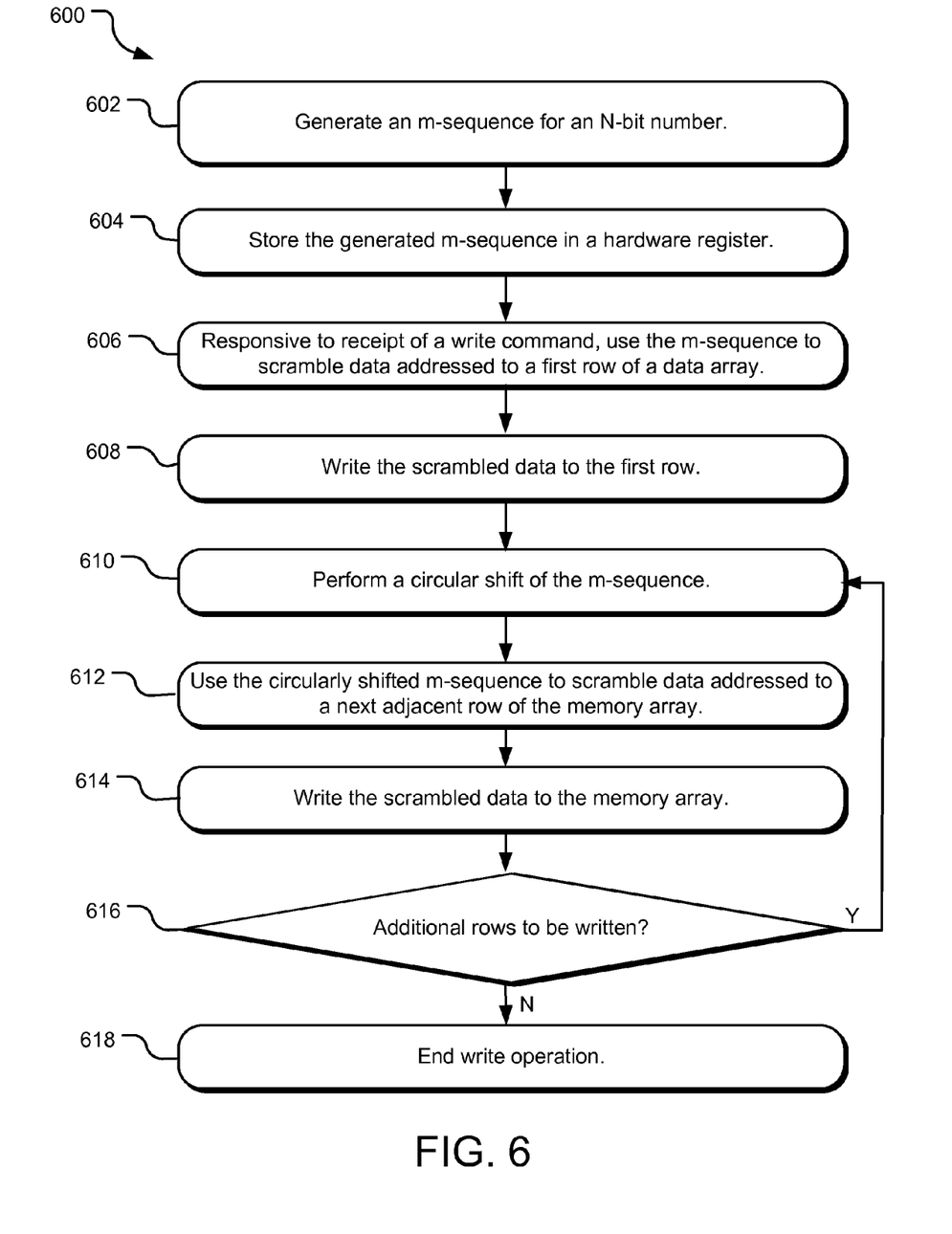
FIG. 6 illustrates example operations for randomizing data in a data array in multiple dimensions.

FIG. 6 illustrates example operations 600 for randomizing data in multiple dimensions. A generation operation 602 generates an m-sequence for an N-bit number. A storing operation 604 stores the m-sequence in a hardware register of a memory controller.

Upon receipt of a write command instructing the memory controller to perform a write operation, a scrambling operation 606 scrambles data addressed to a first row of a memory array. In one implementation, the scrambling operation 606 is performed by calculating a bit-wise XOR between the generated m-sequence and the data addressed to the first row of the memory array. A writing operation 608 writes the scrambled data to the data array.

A shifting operation 610 circularly shifts the m-sequence. In one implementation, this shift is a single-digit shift. In other implementations, this circular shift is greater than 1 digit. Another scrambling operation 612 uses the circularly shifted m-sequence to scramble the data addressed to a next row of the data array that is adjacent to the most recently written row (e.g., the first row). In one implementation, the scrambling operation 612 is performed by calculating a bit-wise XOR between the shifted m-sequence and the data addressed to the next row of the data array. A writing operation 614 writes the scrambled data to the data array.

A determination operation 616 determines whether additional rows of the data array remain to be altered by the write operation. If one or more additional rows are to be altered, operations 610-614 repeat, shifting the m-sequence, scrambling the data, and writing the data row by row until the write operation is complete, at which time an end operation 618 ends the write operation.

If the data array is part of a three-dimensional data block, data in other levels of the block (e.g., other channel select lines) may be randomized in a same or similar manner, applying circular shifts to a scrambling sequence to randomize each consecutive row until all cells in the data block are randomized.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method comprising:
   randomizing data addressed to a first row of a data array using at least a first scrambling sequence; and
   randomizing data addressed to a second adjacent row of the data array using at least a second scrambling sequence that is a circular shift of the first scrambling sequence, wherein at least one of the first and second scrambling sequences include at least a portion of a maximum-length sequence (m-sequence) generated based on a seed of a length (N), wherein N is an integer greater than or equal to 1, the m-sequence having a length $2^{N-1}$.

2. The method of claim 1, further comprising randomizing the data addressed to the first row of the data array using a first plurality of scrambling sequences, and randomizing the data addressed to the second adjacent row of the data array using a second plurality of scrambling sequences, wherein each of the second plurality of scrambling sequences is a circular shift of the one of the first plurality of scrambling sequences.

3. The method of claim 1, further comprising randomizing a first column of the data array using a portion of the first scrambling sequence and randomizing a second column of the data array using first portion of the second scrambling sequence.

4. The method of claim 1, wherein the circular shift is a single digit shift.

5. The method of claim 1, wherein the circular shift is a shift of multiple digits.

6. The method of claim 1, further comprising:
   randomizing data of a third row of the data array using a third scrambling sequence that is a circular shift of the second scrambling sequence, the third row being adjacent to the second row.

7. The method of claim 1, wherein the m-sequence includes every possible binary combination in $2^N$ states exactly once.

8. The method of claim 1, wherein the scrambling sequence is stored in a hardware register of a memory controller that writes data to the data array.

9. The method of claim 1, wherein a portion of the scrambling sequence for a first bitline is equal to a portion of the scrambling sequence of a first wordline.

10. The method of claim 1, wherein the memory array is a 3D NAND array, and a same scrambling sequence is used to scramble each of a first bitline, a first wordline, and a first channel select line.

11. The method of claim 1, wherein randomizing the data of the first row further comprises calculating a bit-wise Exclusive OR (XOR) between the data addressed to the first row and the first scrambling sequence.

12. A processor-implemented method comprising:
randomizing data addressed to a first row of a memory array using a number (M) of initial scrambling sequences, each of the initial scrambling sequences including at least a portion of a maximum-length sequence (m-sequence) generated based on a seed of a length (N), the m-sequence having a length $2^{N-1}$, wherein M and N are both integers greater than or equal to 1;
circularly shifting each of the M number of initial scrambling sequences; and
randomizing data addressed to a second adjacent row of the memory array using the circularly shifted scrambling sequences.

13. The processor-implemented method of claim 12, wherein the memory array is a triple-level cell array and the M number of initial scrambling sequences consists of three scrambling sequences.

14. The processor-implemented method of claim 12, the memory array is a multi-level cell array and the M number of initial scrambling sequences consists of two scrambling sequences.

15. The processor-implemented method of claim 12, wherein the M number of scrambling sequences are stored in a hardware register of a memory controller that writes data to the memory array.

16. The processor-implemented method of claim 12, wherein at least one of the M number of scrambling sequences is a maximum-length sequence dynamically generated by a shift register.

17. Apparatus comprising:
a memory controller configured to randomize data addressed to a first row of a data array using a first scrambling sequence and randomize data addressed to a second adjacent row of the data array using a second scrambling sequence, the second scrambling sequence being a circular shift of the first scrambling sequence, wherein at least one of the first and second scrambling sequences include at least a portion of a maximum-length sequence (m-sequence) generated based on a seed of a length (N), the m-sequence having a length $2^{N-1}$, wherein N is an integer greater than or equal to 1.

18. The apparatus of claim 17, wherein the first column of the data array is randomized using a first portion of the first scrambling sequence and the second column of the data array is randomized using a first portion of the second scrambling sequence.

19. The apparatus of claim 17, wherein the circular shift is a single digit shift.

20. The apparatus of claim 17, wherein the first scrambling sequence is used to randomize three dimensions of data in the data array.

* * * * *